(12) United States Patent
Choi et al.

(10) Patent No.: US 10,204,966 B2
(45) Date of Patent: Feb. 12, 2019

(54) ORGANIC LIGHT-EMITTING DISPLAY DEVICE AND METHOD OF MANUFACTURING THE SAME

(71) Applicant: LG Display Co., Ltd., Seoul (KR)

(72) Inventors: Ho-Won Choi, Paju-si (KR); Sung-Bin Shim, Yangsan-si (KR); Moon-Bae Gee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/690,194

(22) Filed: Aug. 29, 2017

(65) Prior Publication Data

US 2018/0061905 A1 Mar. 1, 2018

(30) Foreign Application Priority Data

Aug. 31, 2016 (KR) ........................ 10-2016-0112244

(51) Int. Cl.
*H01L 27/32* (2006.01)
*G09G 3/3233* (2016.01)
*H01L 51/10* (2006.01)

(52) U.S. Cl.
CPC ........ *H01L 27/3211* (2013.01); *G09G 3/3233* (2013.01); *H01L 27/322* (2013.01); *H01L 27/3246* (2013.01); *H01L 51/102* (2013.01); *H01L 27/3262* (2013.01); *H01L 2227/323* (2013.01)

(58) Field of Classification Search
CPC ............. H01L 27/3211; H01L 27/3262; H01L 27/3246; H01L 51/504; H01L 51/5064; H01L 51/508; H01L 51/5278; H01L 27/322; H01L 2227/323; H01L 51/102; G09G 3/3233; H05B 33/12; H05B 33/22; H05B 33/24
See application file for complete search history.

(56) References Cited

U.S. PATENT DOCUMENTS

| 7,375,464 | B2 * | 5/2008 | Chin ..................... | H01L 27/322 313/112 |
| 9,929,370 | B2 * | 3/2018 | Nakamura .......... | H01L 51/5234 |
| 2007/0108899 | A1 * | 5/2007 | Jung ................... | H01L 27/3276 313/506 |
| 2009/0102352 | A1 * | 4/2009 | Cok .................... | H01L 51/5265 313/498 |

(Continued)

FOREIGN PATENT DOCUMENTS

EP 1 615 473 A1 1/2006

*Primary Examiner* — Joseph L Williams
*Assistant Examiner* — Jose M Diaz
(74) *Attorney, Agent, or Firm* — Seed IP Law Group LLP

(57) ABSTRACT

An organic light-emitting display device that has a modified structure capable of preventing degradation of the aperture ratio and light leakage due to alignment tolerance between upper and lower substrates and a method of manufacturing the same are disclosed. The organic light-emitting display device includes a substrate including a plurality of sub-pixels, an insulation film disposed on the substrate and including recesses each having a bottom surface of a selected area and electrically isolating regions are positioned adjacent to a corresponding one of the recesses such that a pair comprising a recess and an isolation region corresponds to each of the sub-pixels. A first electrode is disposed on the bottom surface of each of the recesses in each of the sub-pixels.

17 Claims, 12 Drawing Sheets

(56) References Cited

U.S. PATENT DOCUMENTS

| | | | |
|---|---|---|---|
| 2009/0121248 A1* | 5/2009 | Sano | H01L 33/54 |
| | | | 257/98 |
| 2009/0278450 A1* | 11/2009 | Sonoyama | H01L 27/322 |
| | | | 313/504 |
| 2010/0171107 A1 | 7/2010 | Jung et al. | |
| 2011/0254037 A1* | 10/2011 | Arasawa | H01L 27/322 |
| | | | 257/98 |
| 2013/0001603 A1 | 1/2013 | Lim et al. | |
| 2014/0117334 A1 | 5/2014 | Nakamura et al. | |
| 2015/0060820 A1 | 3/2015 | Takagi et al. | |
| 2016/0013451 A1 | 1/2016 | Cheng et al. | |
| 2018/0047792 A1* | 2/2018 | Yen | H01L 27/322 |

\* cited by examiner

ORGANIC LIGHT-EMITTING DISPLAY DEVICE AND METHOD OF MANUFACTURING THE SAME

CROSS-REFERENCE TO RELATED APPLICATION(S)

This application claims the benefit of Korean Patent Application No. P 10-2016-0112244, filed on Aug. 31, 2016, which is hereby incorporated by reference as if fully set forth herein.

BACKGROUND

Technical Field

The present disclosure relates to an organic light-emitting display device, and more particularly to an organic light-emitting display device that has a modified structure capable of preventing degradation of the aperture ratio and light leakage due to alignment tolerance between upper and lower substrates and a method of manufacturing the same.

Description of the Related Art

In recent years, the field of displays that provide video images and active Web pages has been rapidly developed with the advent of the information age. Correspondingly, a variety of flat display devices having excellent performance, such as a slim design, low weight and low power consumption, have been developed and have rapidly replaced conventional cathode ray tubes (CRTs).

Current flat display devices may include a liquid crystal display (LCD), a plasma display panel (PDP), a field emission display (FED), and an organic light-emitting display (OLED).

Among the aforementioned ones, the OLED is considered a competitive approach because it does not need a separate light source and can be a compact device design with accurate color reproduction.

The OLED comprises an organic light-emitting diode, which is a self-luminous element, in a sub-pixel and displays an image through the operation of the organic light-emitting diode for each sub-pixel. Since the organic light-emitting diode is a self-luminous element that may be used in illumination devices as well as display devices, the development of the organic light-emitting diode has recently attracted attention in the illumination industry. Further, since the organic light-emitting diode does not need a separate light source unit, it has the advantage of being easily used in flexible display devices or transparent display devices.

The organic light-emitting diode includes an organic light-emitting layer, which is disposed between an anode and a cathode. A hole and an electron are respectively injected from the anode and the cathode into the organic light-emitting layer, and an exciton is formed by combination of the electron and the hole at the organic light-emitting layer. When the exciton transitions from an excited state to a ground state, light is emitted from the organic light-emitting diode.

Hereinafter, the structure of a conventional organic light-emitting display device and problems therewith will be described.

FIG. 1 is a sectional view showing an organic light-emitting diode of a conventional organic light-emitting display device, and FIG. 2 is a sectional view showing the construction of the organic light-emitting diode when a bank is formed in a misaligned manner in the conventional organic light-emitting display device, to which the structure in FIG. 1 is applied.

As shown in FIG. 1, a conventional organic light-emitting display device is constructed such that a first substrate 10 is sectioned into a plurality of sub-pixel regions and an organic light-emitting diode is included in each sub-pixel. The organic light-emitting diode includes a first electrode 11, a bank 12 disposed to partially overlap a marginal region of the first electrode 11, an organic light-emitting layer 13 disposed on the first electrode 11 and the bank 12, and a second electrode 14 disposed on the organic light-emitting layer 13.

In general, the first electrode 11 and the bank 12 are formed by performing an exposure and development process using a photomask.

However, when misalignment of the mask, which is used to form the bank 12, occurs, as shown in FIG. 2, the bank 12 may be formed such that it does not overlap the edge regions of the first electrode 11 in some locations. In this case, the organic light-emitting layer 13, which is formed through a deposition process without an exposure mask after the formation of the bank 12, may be formed such that vaporized organic material that should be deposited only onto the flat top surface of the first electrode 11, because of the misalignment, is also in contact with the exposed lateral region that is the sidewall of the first electrode 11. At this location, it may have a relatively small thickness, or it might be so thin that little or no material is on the sidewall of electrode 11. The organic light-emitting layer may also have a portion on the first substrate 10. One example of this misalignment region is shown in the dashed-line circle labeled with the letter "A" in FIG. 2. Therefore, when the deposition of the second electrode 14 is performed after the formation of the organic light-emitting layer 13, the second electrode 14 may come into contact with the sidewall or lateral region of the first electrode 11, on which the organic light-emitting layer 13 is formed thin or is not present, which may cause an electric short-circuit.

Further, even though the organic light-emitting layer 13 is formed thin on the lateral region of the first electrode 11, the concentration of current in this region is relatively intensified, thus causing degradation upon operation thereof.

Meanwhile, although not illustrated in the drawings, in order to realize color display, the above-described organic light-emitting display device is constructed such that the organic light-emitting layer is a white organic light-emitting layer and such that a second substrate is provided opposite the organic light-emitting layer. A red filter layer, a green filter layer and a blue filter layer, which correspond to each sub-pixel, are provided on the second substrate, and respective black matrix layers are provided between the red filter layer, the green filter layer and the blue filter layer. The second substrate having the above color filter array and the substrate having the above organic light-emitting diode are bonded to each other by interposing an adhesive layer therebetween.

However, since the black matrix layer, the red filter layer, the green filter layer and the blue filter layer, which are formed on the counter substrate, are components that are formed using exposure masks, at least four exposure masks are separately needed for the counter substrate.

Further, when the first substrate 10 and the second substrate are misaligned from each other, the black matrix layers, which are light-blocking elements provided between the color filter layers, may shield the light-emitting region, which may cause a reduction in the aperture ratio. In addition, there may occur a light leakage phenomenon in which color mixture is caused when light leaks from a certain sub-pixel due to misalignment and passes through the color filter of the adjacent sub-pixel.

BRIEF SUMMARY

Accordingly, the present disclosure is directed to an organic light-emitting display device and a method of manufacturing the same that substantially obviate one or more problems of the related art.

One goal of the present disclosure is to provide an organic light-emitting display device that has a structure capable of preventing degradation of the aperture ratio and light leakage due to alignment errors or permitted tolerance between upper as well as lower substrates and a method of manufacturing the same.

Additional advantages, objects, and features of the disclosure will be set forth in part in the description which follows and in part will become apparent to those having ordinary skill in the art upon examination of the following or may be learned from practice of the disclosure. The objectives and other advantages of the present disclosure may be realized and attained by the structure particularly pointed out in the written description and claims hereof as well as the appended drawings.

According to an organic light-emitting display device of the present disclosure, the formation of an organic light-emitting diode and the formation of color filters for color display do not need an exposure and development process, thus reducing the number of masks required. Further, since the color filters are disposed in recesses of an insulation film, it is possible to prevent degradation of the aperture ratio and light leakage due to alignment tolerance between upper and lower substrates.

To achieve these objects and other advantages and in accordance with the purpose of the disclosure, as embodied and broadly described herein, an organic light-emitting display device includes a substrate including a plurality of sub-pixels and an insulation film disposed on the substrate. The insulation film includes recesses, each having a bottom surface having a known area of a selected size and insulation regions each positioned adjacent to a corresponding one of the recesses. A pair comprising a recess and a flat surface corresponds to each of the sub-pixels. A first electrode is disposed on the bottom surface of each recess in each of the sub-pixels, and an organic film is disposed on the insulation film including the first electrode that is disposed in each of the recesses. The organic film includes an organic light-emitting layer. A second electrode is disposed on the organic film, and color filters are disposed on the second electrode at selected locations, filling in a corresponding one of the recesses, corresponding to each of the sub-pixels. Preferably, each color filter has a generally a flat top surface.

The color filters may be in contact at their sidewalls and lateral portions thereof with each other in adjacent ones of the sub-pixels.

The organic light-emitting display device may further include a protective layer disposed on the color filters.

The organic light-emitting display device may further include a protective layer disposed between the second electrode and the color filters.

Each recess may have a sidewall having a positive taper shape around the bottom surface, and the organic film, the second electrode and the protective layer may be formed along the flat surfaces of the insulation film and the lateral portion and the bottom surface of each of the recesses, each of the organic film, the second electrode and the protective layer having a constant thickness.

The organic film may be configured to emit white light.

The organic light-emitting display device may further include a thin film transistor disposed corresponding to each of the sub-pixels of the substrate, and the insulation film may further include a contact hole formed under the bottom surface of each recess in order to expose a portion of the thin film transistor.

The bottom surface of each recess may be located such that the thickness from a surface of the insulation film to the bottom surface is a portion of the overall thickness of the insulation film.

The protective layer disposed on each recess may be formed lower than the insulation film.

In another aspect of the present disclosure, an organic light-emitting display device includes a substrate including a plurality of sub-pixels, and an insulation film disposed on the substrate. The insulation film includes recesses, each having a bottom surface having a known area and depth. Flat surfaces are positioned adjacent to a corresponding recess such that a pair comprising a recess and a flat surface corresponds to each of the sub-pixels. A first electrode is disposed on the bottom surface of each recess in each of the sub-pixels. An organic film is disposed on the insulation film. The first electrode is disposed in each recess. The organic film includes an organic light-emitting layer. A second electrode is disposed on the organic film. A color light filter is positioned overlying over the second electrode and filling the recess. In one embodiment, each of the recesses has the same depth. In another embodiment, each recess has a different depth that is custom-selected based on the color filter in the recess and the desired optical properties of that filter.

In a further aspect of the present disclosure, a method of manufacturing an organic light-emitting display device includes preparing a substrate including a plurality of sub-pixels, then forming an insulation film on the substrate, to make recesses in the insulating layer. Grooves or recesses are formed in selected locations in the insulating layer. The depth of each recess might be the same or they might be different, depending on the optical properties desired for that particular sub-pixel. Each recess has a bottom surface having a known area and flat surfaces each positioned adjacent to a corresponding recess such that a pair comprising a recess and a flat surface corresponds to each of the sub-pixels. The first electrode is then formed on the bottom surface of each recess in each of the sub-pixels. An organic film is formed on the insulation film and the first electrode in each recess to include an organic light-emitting layer. A second electrode is then formed on the organic film.

The forming the first electrode may include forming a first electrode material on the insulation film including the recesses to a constant thickness, coating a photosensitive resist on the first electrode material such that a top surface thereof has a constant height from each of the flat surfaces of the insulation film, exposing the first electrode material on each of the flat surfaces of the insulation film by performing an ashing of the photosensitive resist. This will permit selective removal of the first electrode on the bottom surface of each recess by performing an etching process with respect to the first electrode material using the photosensitive resist as a mask.

The method may further include coating liquid-type color filter materials on the second electrode so as fill in any remaining depth in the recesses corresponding to the sub-pixels, then hardening the liquid-type color filter materials.

The forming color filters having flat surfaces may include removing the color filter materials.

It is to be understood that both the foregoing general description and the following detailed description of the present disclosure are exemplary only. They intended to provide further explanation of the present disclosure so that it can be fully understood and practiced by those of skill in the art, and not as limiting to the scope of the claims.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
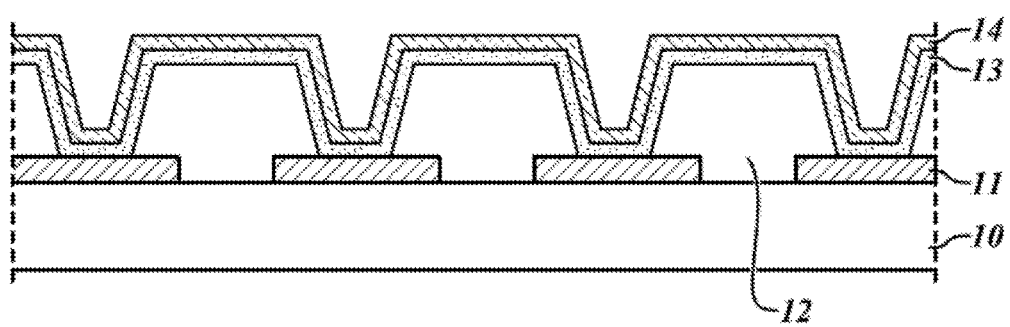
FIG. 1 is a sectional view showing a conventional prior art organic light-emitting display device.
Figure 2:
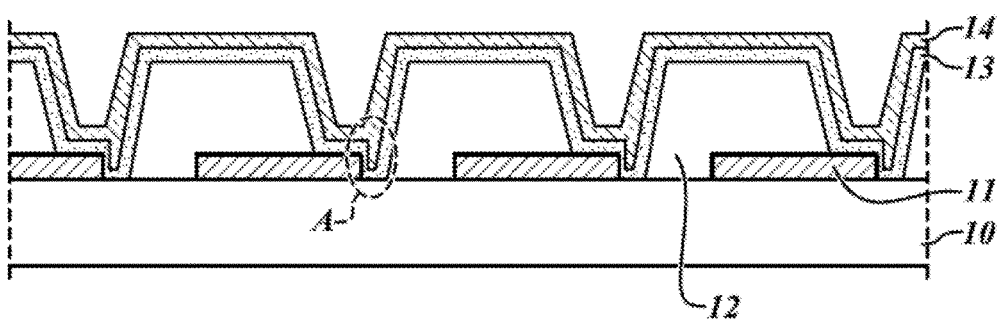
FIG. 2 is a sectional view showing the construction of an organic light-emitting diode when a bank is formed in a misaligned manner in the conventional organic light-emitting display device, to which the structure in FIG. 1 is applied.

Hereinafter, exemplary embodiments of the present disclosure will be described in detail with reference to the accompanying drawings.

The exemplary embodiments of the present disclosure to be described below are provided by way of example so that the idea of the present disclosure can be sufficiently transferred to those skilled in the art to which the present disclosure pertains. Therefore, the present disclosure is not limited to the exemplary embodiments set forth herein but may be modified in many different forms. In the drawings, widths, lengths, thicknesses or the like of elements may be enlarged for the sake of convenience and clarity. Wherever possible, the same reference numbers will be used throughout the drawings to refer to the same or like parts.

Advantages and features of the present disclosure and methods for achieving them will be made clear from embodiments described below in detail with reference to the accompanying drawings. The present disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. The present disclosure is defined by the scope of the claims.

It will be understood that, when an element such as a layer, film, region or substrate is referred to as being "on or overlying" another element, it can be directly on the other element or intervening elements may also be present. On the other hand, when an element such as a layer, film, region or substrate is referred to as being "directly on" another element, this means that there are no intervening elements therebetween.

The spatially relative terms "below," "beneath," "lower," "under," "above," "upper," "overlying," "over," and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

An organic light-emitting display device of the present disclosure may have the cross section shown only in the pixel array region, in which a substrate including constituent components performs display in a planar manner. There is also a surrounding region of electrical structures and connections positioned around the pixel array region. The pixel array region is structured such that an organic light-emitting diode and a thin film transistor electrically connected to the organic light-emitting diode are provided at each of sub-pixels. The surrounding region of the substrate may include a pad region, which is electrically connected to the organic light-emitting diode and the thin film transistor, a pixel address buffer, and a circuit unit, which are electrically connected to the pad region in order to receive signals from the outside and transmit pixel selection signals to the individual pixels in the array.

Figure 3:
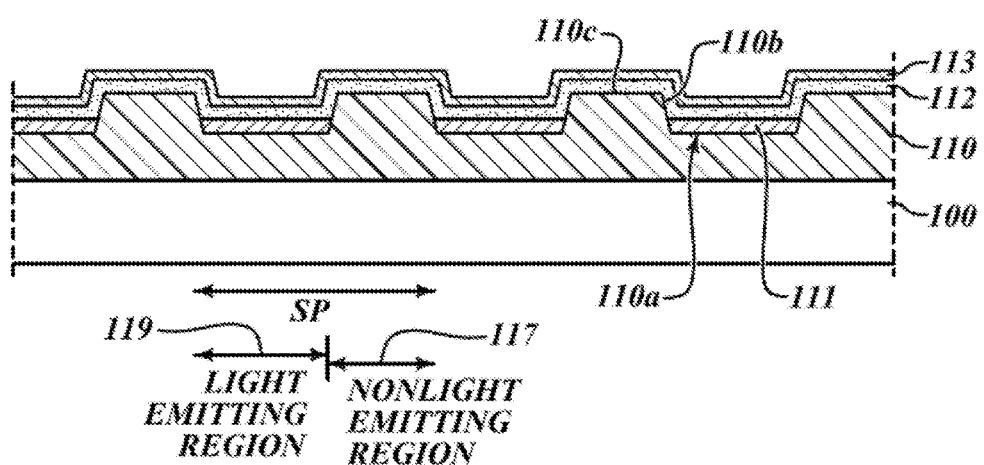
FIG. 3 is a sectional view showing an organic light-emitting diode of an organic light-emitting display device of the present disclosure.

FIG. 3 is a sectional view showing the organic light-emitting diode of the organic light-emitting display device of the present disclosure.

As shown in FIG. 3, the organic light-emitting display device of the present disclosure comprises a substrate 100 including a plurality of sub-pixels SP. There is an insulation film 110 disposed on the substrate 100. The insulation film 110 includes a plurality of recesses 110a, each having a bottom surface having a known area and flat sidewall surfaces. There is a separation wall 110c positioned adjacent to a corresponding recess such that a pair comprising a recess and a separation wall corresponds to each of the sub-pixels. Preferably, this separation wall has a top flat surface, but this is not required. A first electrode 111, is disposed on the bottom surface of the recess 110a in each of the sub-pixels. An organic film 112 including an organic light-emitting layer is disposed on the insulation film 110 and the first electrode 111. A second electrode 113 are disposed on the organic film 112.

Here, the insulation film 110 is provided at the top surface thereof with the recesses 110a that have sidewalls 110b. There is a separation wall 110c between each recess 110a. This separation wall may have a top flat region, or in other embodiments, the separation wall may have other contours or shapes. Since the recess 110a and the wall 110c are made in the same process steps, they will be self-aligned with respect to each other and each recess will be assured of being separated from each other recess by a separation wall 110c which has a known width. A single mask is used to define them both at the same time. The recesses 110a have a constant depth such that the organic film 112 and the second electrode 113 are provided along the stepped portions formed by each recess. To this end, the insulation film 110 may have a thickness ranging from 1 to 10 μm and may be made of a material having an excellent electrical insulation property, for example, an organic material such as photo acrylic or benzocyclobutene (BCB). The insulation film 110 may be made of a transparent material or of a colored or black light-blocking material. It may be more advantageous to use a light-blocking material for insulation film 110 in a top-emission type array.

As can be appreciated, the pixel array may be of a type which emits light from the top surface, through the electrode 113. Alternatively, it may emit light through the substrate 100 and thus be a bottom light-emitting array. In the design in which the pixel array is a top light-emitting array, the substrate 100 and its insulation film 110, together with electrode 111 can be opaque materials. In one embodiment, the electrode 111 together with other portions of insulation film 110, may include light reflection layers in order to maximize the amount of light that is output from the top surface through electrode 113. Alternatively, if the pixel array is a bottom light-emitting array, then the insulation layer film 110 as well as the substrate 100, are made of a transparent material, as is the electrode 111. Materials to form transparent electrodes are well known in the art, as are materials to form transparent electrical insulation layers and substrates, and any one of such materials may be used in the embodiments described herein.

The insulation film 110 is also referred to as an overcoat layer, which is named after its function of covering and planarizing a thin film transistor array disposed therebelow.

The bottom surface of each recess 110a has a selected area and is formed flat. The first electrode 111 is disposed on the bottom surface. The region in which the first electrode 111 is disposed is defined as a light-emitting region 119. The reason for this is that an organic light-emitting diode is formed corresponding to each of the sub-pixels by the organic film 112 and the second electrode 113, which are formed vertically on the first electrode 111 disposed in each of the recesses. Here, the recesses 110a are provided separately from each other corresponding to the sub-pixels, and the first electrode 111 is necessarily located on the bottom surface of each recess 110a. As a result, independent operation of each of the sub-pixels is enabled. The non-light-emitting region 117 of each sub-pixel corresponds to the separation wall between them. In the embodiment shown in FIG. 3, each of the recesses is shown as having the same width and the same depth. Each recess will correspond to a particular sub-pixel, such as red, green, blue, white, or other color. In some embodiments, it is desired for each sub-pixel to have the same area. In this case, the footprint area of the each recess 110a will be the same so that the area of each electrode 111 is the same for each sub-pixel. In other embodiments, it is desired to have the footprint area, namely the area of the bottom of the recess of each sub-pixel, to be different. For example, it may be desired to have the blue sub-pixel somewhat larger in area than the green sub-pixel, and have both of these somewhat larger in area than the red sub-pixel.

A pixel may be made up of a variety of different sub-pixels; in one embodiment the sub-pixels are red, green, and blue, while in other embodiments the sub-pixels may be red, green, blue, and white, and in other embodiments, different color combinations of sub-pixels may make up a single pixel. Because the recesses are formed using a single mask, and the pattern of the mask will determine the area of the bottom of the recess, and thus the area of the light emitted by each sub-pixel, it is easily possible to select the area for each sub-pixel to be a desired size, depending on the desired operating characteristics of the particular display.

The first electrode 111 may be formed in any one of a single-layered structure and a multi-layered structure, both of which may include a transparent electrode. In the case in which the first electrode 111 is formed in a multi-layered structure, the first electrode 111 may include a transparent electrode and one or more reflective electrodes. When two or more reflective electrodes are provided, the reflective electrodes may be divided so as to be disposed on and under the transparent electrode.

Because the formation of the organic film 112 does not need a deposition mask corresponding to each of the sub-pixels, the organic film 112 may be evenly formed on the top surface of the first electrode 111, the sidewalls 110b of each recess 110a around the first electrode 111, and the separation walls 110c of the insulation film 110. Namely, the organic film 112 may be formed by a process that only partially conforms to the underlying layer.

In a fully conformal deposition process, the layer being deposited conforms exactly to the layer on which it is being deposited, having a uniform thickness for its entire length, as that term is known in the semiconductor manufacturing art. On the other hand, some layers only partially conform in the deposition process, and may form a layer of uniform thickness on most flat surfaces, but on sloped sidewalls, at corners, or at abrupt edges they may be only partially conformable. In some embodiments, they may only partially conform, and therefore may be somewhat thicker or thinner at slopes or at abrupt edge changes in the underlying surface. The material and forming technique for light-emitting layer provided in the organic film 112 is only a partially conformal deposition, namely it generally conforms to the uppermost exposed surface of the layer 110 on which it is deposited at the flat regions, however, at some abut edges of the underlying surface, it does not fully conform and thus will have different thicknesses at some regions.

In this case, because an organic material is converted to a vapor state and deposited onto the substrate 100 and it only generally conforms to the lower layer, it is preferable for the sidewalls 110b adjacent to the bottom surface of the recess 110a to have a positive taper shape. The purpose of this is to enable the recess 110a to better perform a function as a light-emitting region. If the sidewalls 110b of the recess 110a is formed approximately vertical, when an organic material having only a partially conformal nature is supplied, the organic material is not effectively deposited with a uniform thickness on the vertical sidewalls of the recess 110a, which may cause a short-circuit between the first electrode 111 and the second electrode 113, which is formed later. Therefore, in order to avoid this problem, it is preferable for the sidewalls 110b of each recess 110a to have a positive taper shape, to ensure that an organic material is evenly deposited, with an even thickness on the flat surface of the insulation film 110, the first electrode 111, and the regular-tapered lateral portion, namely the sidewalls of the recess 110a, thus completing the formation of the organic film 112. Therefore, the design provides for the use of an organic film 112 which is only partially conformable, as well a layer which is fully conformable. Such a structure permits use of a wide range of different types of organic films as well as different deposition techniques for applying the organic film 112. Various CVD or TCVD processes can be used for this deposition step.

Of course, the shape of the sidewalls 110b of recess 110a is not limited to the positive taper shape but may be a vertical shape or a slightly reverse taper shape, depending on the formation process for the organic film 112. If the deposition process is highly conformable, then more vertical sidewalls 110b can be used, but if it is less conformable, then more gently sloped sidewalls should be used to ensure that sufficient organic material of the proper and uniform thickness is supplied to overlay the first electrode 11. Further, the first electrode 111 may be filled from the bottom surface up to the end of the sidewalls portion of the recess 110a. Namely, if a highly conformable material and process is used for the organic film 112, then the sidewalls 110b can be vertical or even have a slight reverse taper and have sufficient thickness of organic film 112 to ensure that when the second electrode 113 is applied, it will be evenly spaced from the first electrode 111.

The slope of the sidewalls 110b, together with the recesses 110a and the upper surface of wall 110c of the insulating layer is selected to provide for the formation of an organic film 112 which has a uniform thickness throughout its entire length across the entire pixel array. This provides the benefit of uniform current flow between electrodes 111 and 113 and the avoidance of any hot spots due to increased current flow at locations where the organic film 112 may be thinner or have voids.

The organic film 112 may be configured as a single organic light-emitting layer; however, the embodiment is not limited thereto. The organic film 112 may include an organic light-emitting layer and one or more organic common layers disposed on and under the organic light-emitting layer. For example, the organic common layer disposed under the organic light-emitting layer may include a hole injection layer and a hole transport layer, and the organic common layer disposed on the organic light-emitting layer may include an electron transport layer and an electron injection layer.

Further, the organic film 112 may be formed in a multi-stack structure, in which a light-emitting layer and an organic common layer may be provided at each of the stacks and a charge-generating layer may be disposed between the stacks to supply holes and electrons to the stack adjacent thereto.

For example, in the case in which the organic film 112 is formed in a single stack structure, the organic light-emitting layer may be a white-light-emitting layer. In the case in which the organic film 112 is formed in a multi-stack structure, it is designed to emit white light through a combination of light from the respective stacks. The light-emitting layers of the respective stacks may be light-emitting layers configured to emit light of different colors from each other or may be light-emitting layers configured to identically emit white light.

Because the second electrode 113 is deposited on the organic film 112 by means of sputtering without using a mask corresponding to each of the sub-pixels, the second electrode 113 is formed as a blanket deposition along the entire exposed surface of the organic film 112.

In this case, when the bottom surface of the recess 110a has a first depth, each of the organic film 112 and the second electrode 113 has a constant thickness such that the sum of the thickness of the organic film 112 and the thickness of the second electrode 113 is less than the first depth, with the result that the organic film 112 and the second electrode 113 are formed along the profile of the flat surface and the recess of the insulation film 110, and the recess 110a is visible even after the formation of the second electrode 113, as can be seen in FIG. 3.

As described above with reference to FIG. 3, the organic light-emitting display device of the present disclosure may be embodied in a bank-less structure in which an existing bank that is formed corresponding to each light-emitting region is omitted and the organic film 112 is formed with a constant thickness on the first electrode 111 in the recess 110a and the gently regular-tapered sidewalls 110b of the recess 110a. As a result, a short-circuit between the first electrode 111 and the second electrode 113 may be prevented and current leakage from a corner of the light-emitting region may be prevented by the organic film 112 that is deposited to a constant thickness on the sidewalls 110b of the recess 110a.

Hereinafter, the bank-less structure according to a comparative example will be described in comparison with the above-described organic light-emitting diode of the present disclosure.

Figure 4:
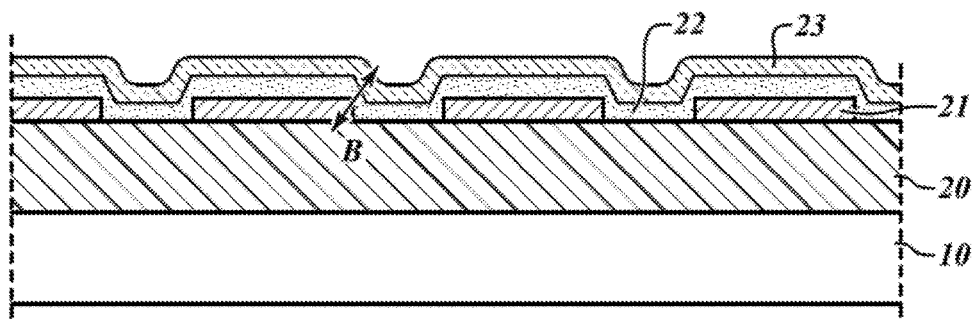
FIG. 4 is a sectional view showing a problem of a bank-less structure according to a comparative example.

FIG. 4 is a sectional view showing a problem of the bank-less structure according to the comparative example.

As shown in FIG. 4, the bank-less structure according to the comparative example is embodied such that an overcoat layer 20 for covering and planarizing a thin film transistor array (not shown) is formed on a substrate 10, a first electrode 21 is formed on each of sub-pixels, and subsequently an organic light-emitting layer 22 and a second electrode 23 are formed. Here, the first electrode 21 is formed in a manner by using a photoresist pattern that is formed by deposition on a first electrode-forming material. The metal layer is formed as a blanket layer on overcoat layer 20, and then it is covered by a coating of photoresist, and this is followed by exposure and development using a mask for the formation of the first electrode. The first electrode-forming material is etched using the photoresist pattern. However, the first electrode 21 is formed thin and a side of the first electrode 21 is formed approximately vertically, which may cause problems in that the organic light-emitting layer 22 formed subsequently thereto is not effectively deposited with uniform thickness on the side of the first electrode 21. If the layer 22 is formed thin on the side of the first electrode 21, this will lead to severe concentration of current near the side of the first electrode 21, as shown at the location marked by the arrow "B."

On the other hand, according to the organic light-emitting diode of the present disclosure, as shown in FIG. 3, since the first electrode 111 is formed along the bottom surface of the recess 110a, the top surface of the first electrode 111 becomes flat, and consequently the organic film 112 is deposited on the first electrode 111 in a flat manner with full uniform thickness. In addition, since the sidewall 110b of the recess 110a has a positive taper shape, deposition of an organic material has a uniform thickness along the sidewall 110b of the recess 110a. As a result, the concentration of current in the corner of the light-emitting region may be prevented and the lifespan of the product may be increased.

In addition, according to the organic light-emitting diode of the present disclosure, since the recess 110a of the insulation film 110 is formed at the time at which a contact hole is formed in the insulation film 110 in order to achieve electric connection between a portion of the thin film transistor and the first electrode, an additional masking process is not required and further use of a mask for forming the first electrode may be omitted. In addition to being able to eliminate one or more masks, it is possible to also solve the problem of concentration of current in the corner of the light-emitting region, which is associated with a conventional prior art bank-less structure.

Hereinafter, a method of manufacturing the organic light-emitting diode of the present disclosure will be described with reference to the drawings.

FIGS. 5A to 5G are sectional views showing the method of manufacturing the organic light-emitting diode of the present disclosure.

First, a substrate 100 including electric circuits and transistors for use with a plurality of sub-pixels is prepared.

Subsequently, an overcoat layer for covering a thin film transistor array (not shown in FIG. 5A, but shown in FIG. 9) is coated with the insulation 110 to a constant thickness on the substrate 100. It is then selectively removed to a desired depth at selected locations, as shown in FIG. 5A, thereby forming an insulation film 110, which includes recesses 110a each having a bottom surface having a known, selected area and separation walls 110c each positioned adjacent to a corresponding recess 110a such that a pair comprising a recess 110a and a wall 110c corresponds to each of the sub-pixels SP.

Figure 5A:
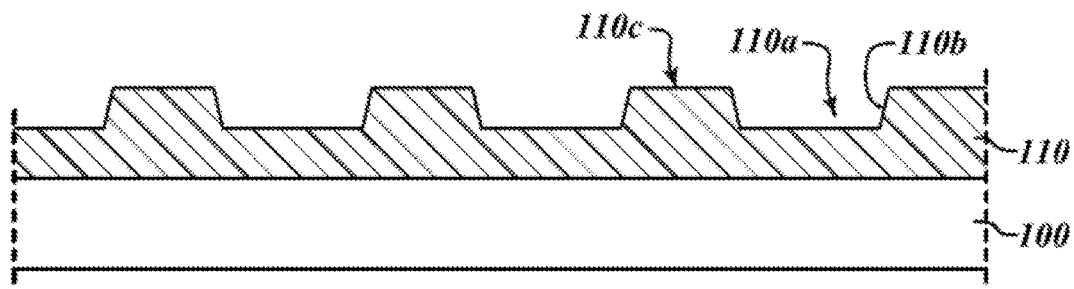
FIGS. 5A to 5H are sectional views showing a method of manufacturing the organic light-emitting diode of the present disclosure according to various embodiments.

The recess pattern shown on FIG. 5A can be formed by any conventional method known in the integrated circuit and semiconductor processing art. The insulating layer 110 can be patterned and etched to a desired depth using standard wet etch or plasma etching techniques. There are well-known wet edge techniques which produce a gradual slope of the sidewalls 110b of the recess 110a.

In this etch process, a contact hole 109 (refer to FIG. 9) may be formed under the bottom surface in order to expose a portion of the thin film transistor.

Figure 5B:
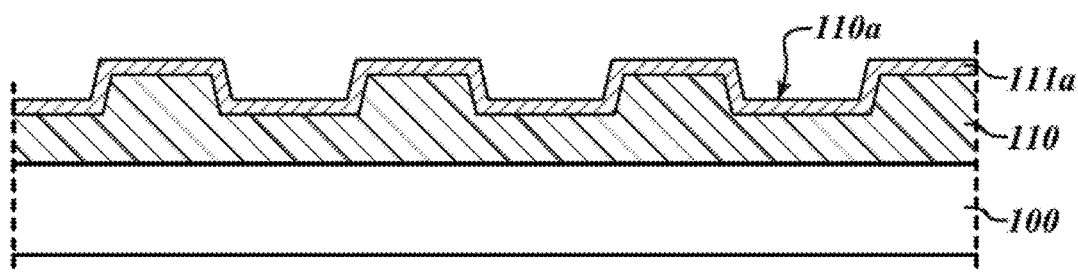

Subsequently, as shown in FIG. 5B, a first electrode material 111a is formed to a constant thickness on the insulation film including the recesses 110a. The electrode deposition can be formed by a standard CVD deposition of any acceptable conductor. Preferably, a processing material is used in which the electrode 111a will conform with uniform thickness to the upper surface of the insulator 110.

Figure 5C:
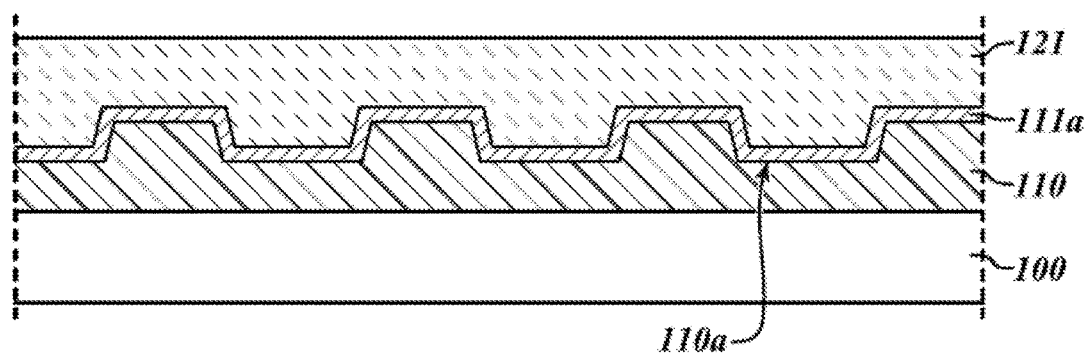

Subsequently, as shown in FIG. 5C, a photosensitive resist 121 is coated on the first electrode material 111a such that the top surface thereof has a constant height from the flat surface of the insulation film.

Figure 5D:
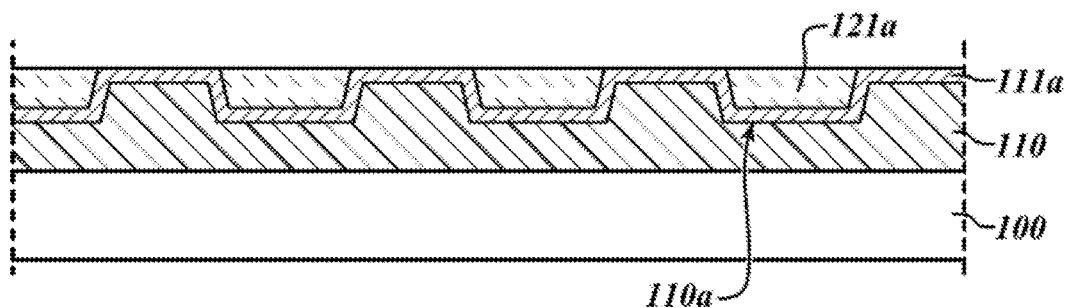

Subsequently, as shown in FIG. 5D, a photosensitive resist pattern 121a is formed through ashing of the photosensitive resist 121 until it exposes the first electrode material 111a that is located on the top surface of the insulation film 110. Here, the key point is that the photosensitive resist 121 is patterned to a constant thickness through a blanket removal process of the photosensitive resist 121 without an additional exposure process. The blanket removal process of the photoresist may be by any acceptable technique, including ashing, blanket etching, whether wet etch or reactive ion etch, CMP, or other known process for uniform removal of a blanket layer covering a substrate. The removal process of the photoresist 121 continues until the metal layer 111a is exposed on the top surfaces of the insulation film 110. Subsequently, a blanket etch removal of layer 111a is carried out. This can be carried out by any acceptable technique, with a wet etch being preferred. This blanket removal also is done without an additional exposure process or further mask, and therefore saves a masking layer. It ensures that the electrode is self-aligned in the recess because the blanket wet etch can be carried out as a timed etch that will remove all electrode material that is not in the bottom of the recess. Any blanket etch or other removal technique can be used, whether reactive ion etch, plasma etch, or other equivalent. The type of etch selected may depend on the slope of the sidewalls 110b, as well as other factors, in order to obtain the results shown in FIG. 5F, in which the electrode 111 is positioned in the bottom of each recess 110a.

Figure 5E:
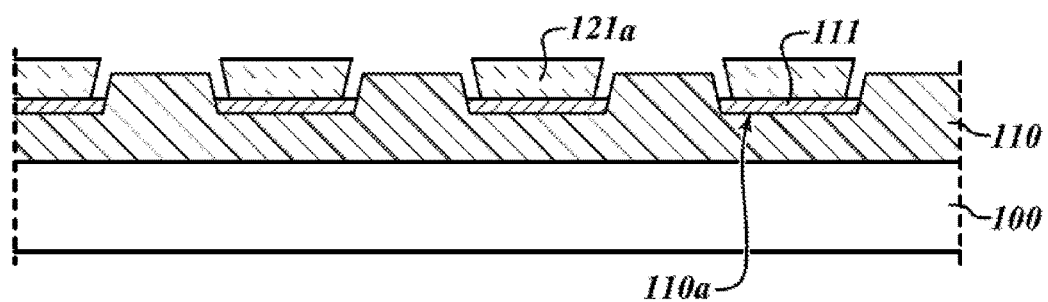

Thus, as shown in FIG. 5E, the first electrode material 111a is etched using the photosensitive resist pattern 121a, which remains in the recesses 110a, as a mask, such that the first electrode material 111a remains only on the bottom surface of each of the recesses 110a, thus completing the formation of a first electrode 111. That is, the first electrode 111 is formed in a self-alignment manner due to the structure of the recess 110a, without performing a photolithography process including exposure and development.

Figure 5F:
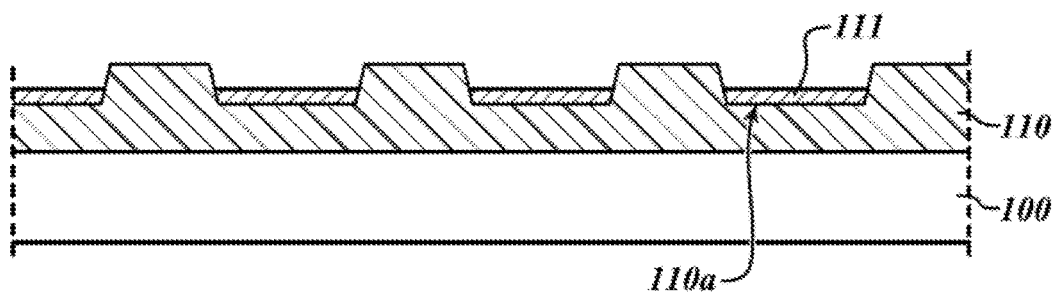

After the layer 111 is etched to the desired shape, a selective etch or ashing of the photosensitive resist pattern 121a is carried out, resulting in the structure shown in FIG. 5F.

Figure 5G:
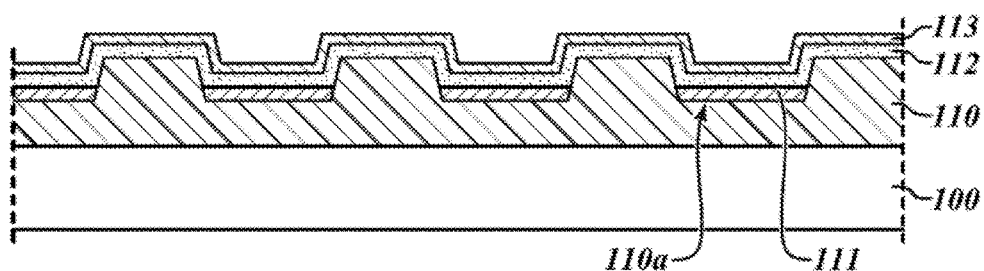

Subsequently, as shown in FIG. 5G, an organic film 112 including an organic light-emitting layer is formed on the insulation film 110 including the first electrode 111 disposed in each of the recesses 110a. The organic film 112 can be formed by any acceptable deposition process, preferably a type of deposition process which is a conformal deposition to the upper surface of insulator 110 and the electrode 111.

Subsequently, a second electrode 113 is formed on the organic film 112, also by a blanket, conformal deposition process.

That is, the region of the organic light-emitting diode of the present disclosure is defined by the overcoat layer that has the recesses and is disposed on the substrate without the formation of a bank, and the first electrode is not shielded by a bank. As a result, the region at which the first electrode is formed may perfectly serve as a light-emitting region and the aperture ratio may be improved.

In addition, the use of one or more masks required for the formation of a bank may be omitted, and the number of masks used for the formation of the first electrode may also be reduced because the first electrode is formed in a self-alignment manner.

Figure 5H:
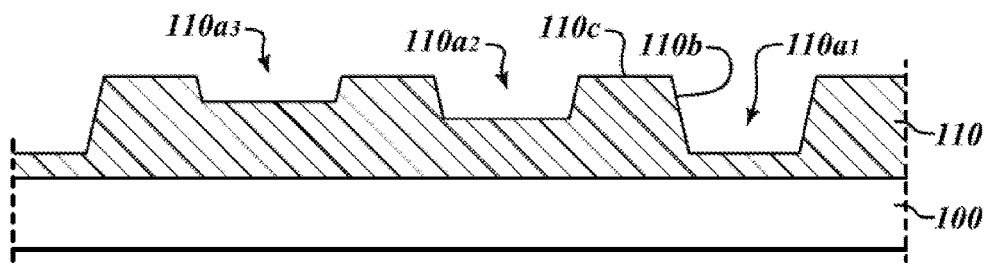

FIG. 5H shows an alternative embodiment according to one preferred process and structure for making sub-pixels that will form a single pixel. As shown in FIG. 5H, three different recesses 110a are shown: a first recess $110a_1$, a second recess $110a_2$, and a third recess $110a_3$. Each of these recesses has a different depth. The depth of the recess will determine the final height of the color filter for each sub-pixel, as will be shown hereafter. In particular, light is created at the organic film 112 having the light-emitting layer, and passes through the material above the recess. The depth of the recess, therefore, determines the height of material that the light must pass through before it is emitted.

By etching the recesses to a selected depth, the exact amount of material which the light passes through can be custom-selected for each sub-pixel.

The ability to custom-select the height of the color filter by simply changing the depth of the recess provides significant benefits in the manufacturing process. The depth of a selected recess 110a can be easily determined based on well-known etch chemistry and etch process technology, based on timing or other techniques. While a single base mask may be used to create the initial shape for each of the recesses, simple overlays may be applied at different stages during the etching process so that the etching of recesses $110a_1$ and $110a_2$ will continue while the etching of recess $110a_3$ is blocked. Then, at a later step in the same etching process, once the recess $110a_2$ has reached the selected depth, then access to it can be blocked, while the etching of recess $110a_1$ continues, until $110a_1$ has reached a selected depth. Thus, with the use of a single definition mask, which defines the area of the sub-pixel, and the relative locations of each recess 110a to each other recess, the depth of a particular recess can be custom-selected based on the etching process and the timing for each recess. Since the location of the recesses has been previously defined by the single definition mask, it is possible to provide a simple blocking mechanism, whether another by use of a broad mask or other technique. The additional blocking mechanism only needs to be sufficiently aligned to block access to the recesses whose etching is to stop, and thus may have a wide range of tolerances. Namely, since the exact location of each recess has been defined with respect to every other recess in a single recess definition mask, any mask used later in process to block etching can be applied without the use of extremely tight tolerances, which provides benefits in low-cost manufacturing of the product, while at the same time ensuring proper formation of the structure of FIG. 5H.

There are numerous other techniques by which a particular recess can made to a selected depth. For example, a different mask and etch process can be used for each shallow recess $110a_3$ while applying, at a later process step, a different mask and etch process for $110a_2$, and similarly for $110a_1$. Namely, it is not required to use a single recessed definition mask for each, but rather a separate recess mask and etch process can be used for each recess on the display that has a different depth. Thus, this is a second way that the different depth recesses can be created.

Any process that creates the different depths of the recesses as shown in FIG. 5H is acceptable, not just the two methods described herein. The height of insulating film 110 is selected to ensure that the deepest recess $110a_1$ will have it bottom surface positioned some minimum distance above the substrate 100 and there will be a sufficient thickness of the layer of insulating material between the bottom of the recess 110a and the top of the substrate 100 to ensure that there is electrical isolation between the two regions.

Hereinafter, the organic light-emitting display device including the organic light-emitting diode of the present disclosure will be described.

Figure 6A:
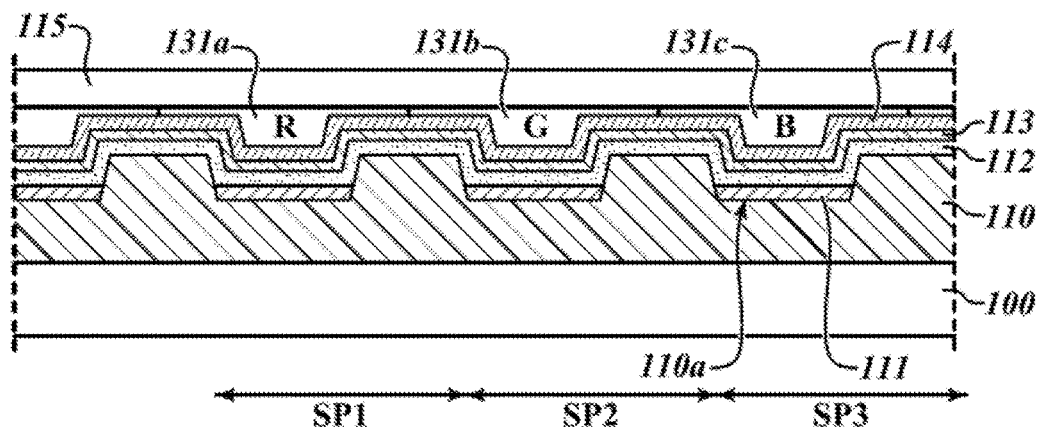
FIG. 6A is a sectional view showing the organic light-emitting display device of the present disclosure according to one embodiment.

FIG. 6A is a sectional view showing the organic light-emitting display device of the present disclosure.

As shown in FIG. 6A, the organic light-emitting display device of the present disclosure comprises the substrate 100 including a plurality of sub-pixels, the above-described organic light-emitting diode disposed on the substrate 100 corresponding to each of the sub-pixels, and color filters 131a, 131b and 131c each disposed on the second electrode 113 and filling a corresponding one of the recesses 110a corresponding to each of the sub-pixels and each having a flat top surface. Sufficient material of color filters 131a, 131b, 131c is deposited into each recess to fully fill each respective recess.

The location of the respective sub-pixels is shown in FIG. 6A with the lines SP1, SP2, and SP3. The arrows at the end of each of the respective lines SP1 indicate the edges of each sub-pixel. As previously described with respect to FIG. 3, each sub-pixel includes two regions, a light-emitting region, which corresponds to electrode 111, and a non-light-emitting region, which corresponds to a separation wall 110c.

The color filters 131a, 131b and 131c are in contact at lateral portions thereof with each other in the respective sub-pixels, and the organic light-emitting display device of the present disclosure does not employ a black matrix. This is because the color filters 131a, 131b and 131c are located in the corresponding recesses on the substrate 100. That is, since the light from the organic film 112 in each of the recesses 110a is output in the form of straight light from the flat light-emitting region, the light is prevented from passing through the adjacent sub-pixels. As a result, an existing black matrix, which is provided to prevent color mixture between the adjacent pixels, may be unnecessary. This avoids further processing and layer application steps. It also provides for greater light emission and a brighter display of the respective colors.

Further, a conventional structure, in which color filters are disposed at a counter substrate, has a problem in that color mixture between sub-pixels occurs due to an optical gap caused by a substrate, a counter substrate and an adhesive layer. However, the organic light-emitting display device of the present disclosure, in which the color filters are disposed in the recesses on the substrate, may prevent color mixture between the sub-pixels and may prevent degradation of the aperture ratio due to misalignment between a substrate and a counter substrate.

Here, the organic light-emitting diode includes an insulation film 110, which includes recesses 110a each having a bottom surface having a known area of a selected size and flat surfaces each positioned adjacent to a corresponding concave region, a first electrode 111, which is disposed on the bottom surface of the recess in each of the sub-pixels, an organic film 112, which is disposed on the insulation film 110 including the first electrode 111 disposed in each of the recesses and includes an organic light-emitting layer, and a second electrode 113, which is disposed on the organic film 112.

There may be further provided a first protective layer 114, which is formed on the second electrode 113 before the formation of the color filter layers 131a, 131b and 131c in order to prevent the introduction of impurities and moisture.

The first protective layer 114 may be formed in a multi-layer structure in which an organic film and an inorganic film are alternately arranged. At this time, the sum of the thickness of the protective layer 114, the thickness of the second electrode 113 and the thickness of the organic film 112 including the organic light-emitting layer is less than the depth of each of the recesses 110a. Therefore, the protective layer 114 is also formed along the surface profile of the flat surface and the recess 110a of the insulation film 110.

There may be further provided a second protective layer 115, which is formed on the flat color filter layers 131a, 131b and 131c in order to protect the color filter layers from external shocks or damage.

According to the organic light-emitting display device of the present disclosure, the formation of the organic light-emitting diode and the formation of the color filters for color display do not need an exposure and development process, thus reducing the number of masks required. Further, since the color filters are disposed in the recesses of the insulation film, it is possible to prevent degradation of the aperture ratio and light leakage due to alignment tolerance between upper and lower substrates.

The organic light-emitting display device of the present disclosure is formed through the following processes in order to realize a structure in which the color filter layers 131a, 131b and 131c have flat top surfaces.

Figure 6B:
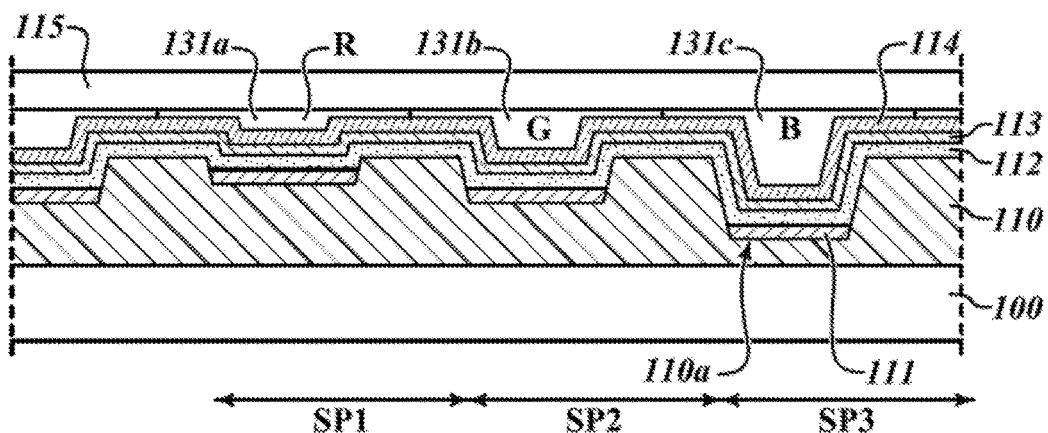
FIG. 6B is a sectional view showing the organic light-emitting display device of the present disclosure according to second embodiment.

FIG. 6B illustrates the completion of the sub-pixel formation of the embodiment of FIG. 5H in which the recesses have different depths. As shown in FIG. 6B, a first sub-pixel SP1a having a red color filter 131a has a shallow depth. A second sub-pixel SP2 corresponding to a green color filter 131b may have a deeper depth, and thus have more green color filter material through which light must pass before it exits the display. A third sub-pixel SP3, shown here as having a blue color filter 131c, as one example, will have an even greater depth, and thus the light emitted by the organic film having 112 the light-emitting layer will have to pass through an even greater amount of the blue filter material before exiting the display. The different depths for different colors, as shown in FIG. 6B, are examples only, and, of course, the depths may vary based on different colors in any particular display, the properties of each filter, the desired light balance and other features. For example, in other case, the blue color filter 131c and the red color filter 131a are switched with each other. That is, a blue color filter 131c may be positioned in the first sub-pixel which has the shallowest depth and a red color filter 131a may be positioned in the third sub-pixel which has the deepest depth.

As can be appreciated, each color filter may have different light attenuation properties. The red color filter material may have greater attenuation than the green color filter material, both of which may have greater attenuation than the blue color filter material. If it is desired to have the light exit at the same brightness for each sub-pixel, then it might be preferred to have the red color filter material be thinner so that as light exits from the red filter it will have the same brightness, namely the same luminosity, as the light exiting the green and blue color filter materials. Of course, this amount light output can also be controlled by the drive from the transistor if desired, based on the data input and the drive signal. The amount of drive current, and thus the light output level might also vary based on the sizes of the drive transistors and their W/L ratios. Thus, the ability to provide selected different thicknesses of the color filter material for each sub-pixel provides yet a different, and in many cases, a more beneficial and faster way to vary the light output by each color of the display. For example, it may permit the sub-pixel drive transistor to be operated in the saturation mode for all transistors of the sub-pixels, which has some benefits in operation.

The depth of each recess 110a can be tuned to the light transmissive properties of the color filter material to be placed therein, as well as the desired brightness aspects of each particular color for any particular display. The light transmissive properties of each of the color filters to be used—red, green, or blue—will be known to the designer, and therefore the depth of each recess is selected to achieve a desired light output. In some embodiments, it may be desired to have the red recess the deepest, and the blue the most shallow, the example being shown in FIG. 6B being only for illustration purposes.

It is also to be noted that the thickness of the various layers in FIGS. 3 and 5A-7H is not to scale. In particular, the layers 111, 112, and 113 will generally be much, much thinner than those shown. Even for the most shallow pixel, all of these layers will not fill the recess. Therefore, in most embodiments, the layer 114 will be near the bottom or lower half of the recess and when the color filter material is added, it will fill the rest of the recess to the top. The color filter will therefore have a bottom region that which is within the recess and the color filter will fill the rest of the recess from the mid region to the top region of the recess.

The color filter material as shown in FIGS. 6A and 6B is preferably formed using inkjet printing. In particular, a high-quality precise inkjet print head will dispense the red color filter material into the recesses 110a of the first sub-pixels SP1, green color filter material into the recesses 110a of the second sub-pixels SP2, and blue color filter material into the recesses 110a to fully fill any remaining portions in the third sub-pixels SP3, and in some instances to overfill each recess 110a and then etch it back. It will be formed as a liquid-type layer, and then later hardened by the appropriate cure process. Inkjet printing of liquid-type color filters provides a number of advantages in precise application of each color filter material, both in its location and in the quantity deposited. The inkjet print process can be quite precise in the amount of liquid material dispensed at each location, as well as the location at which it is dispensed. As described elsewhere herein, after the application of the color filter material, the material is cured and hardened using known techniques, after which a second protective layer 115 is applied.

In a different embodiment, each sub-pixel SP1, SP2, SP3 may have different widths. The different widths can compensate different color transmissive properties.

FIGS. 7A to 7H are sectional views showing a method of manufacturing the organic light-emitting display device of the present disclosure.

As shown in FIGS. 7A to 7E, the method of manufacturing the organic light-emitting display device of the present disclosure is performed along the same lines to the above-described method of manufacturing the organic light-emitting diode set forth with respect to 5A-5G until the formation of the second electrode 113 is completed and will not be repeated here.

Figure 7A:
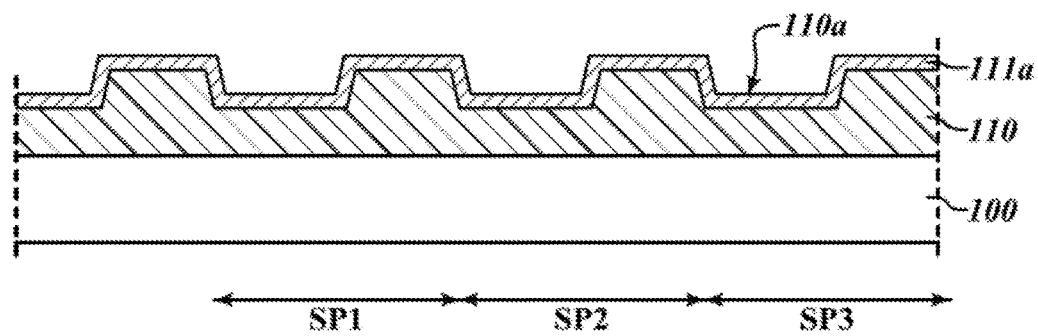
FIGS. 7A to 7H are sectional views showing a method of manufacturing the organic light-emitting display device of the present disclosure.
Figure 7B:
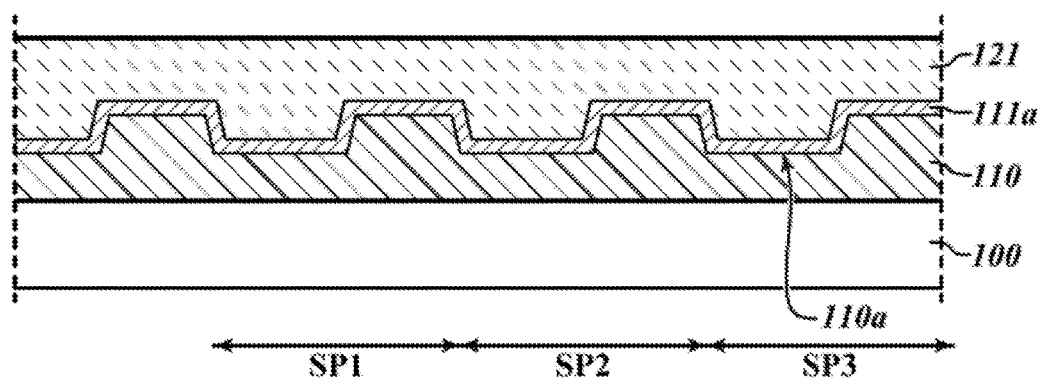
Figure 7C:
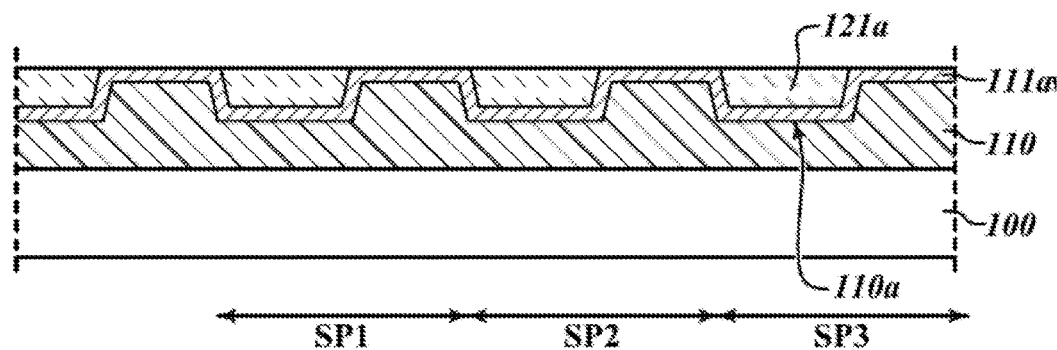
Figure 7D:
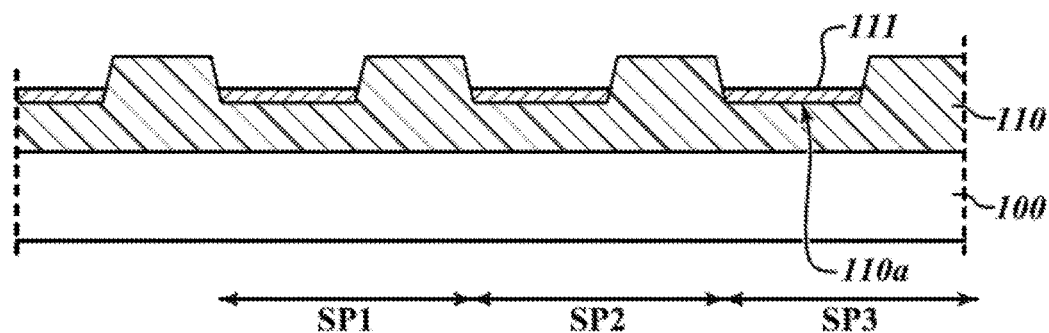

As shown in FIG. 7B, photoresist layer 121 is applied. The photoresist is uniformly etched to expose the top surfaces of the electrode 111a as shown in FIG. 7C. Afterwards, the portions of the electrode layer 111a are etched away from the exposed surfaces using any acceptable etch, such as a wet etch. This will result in the electrode 111 being at the bottom of the recess 110a as shown in FIG. 7D.

Figure 7E:
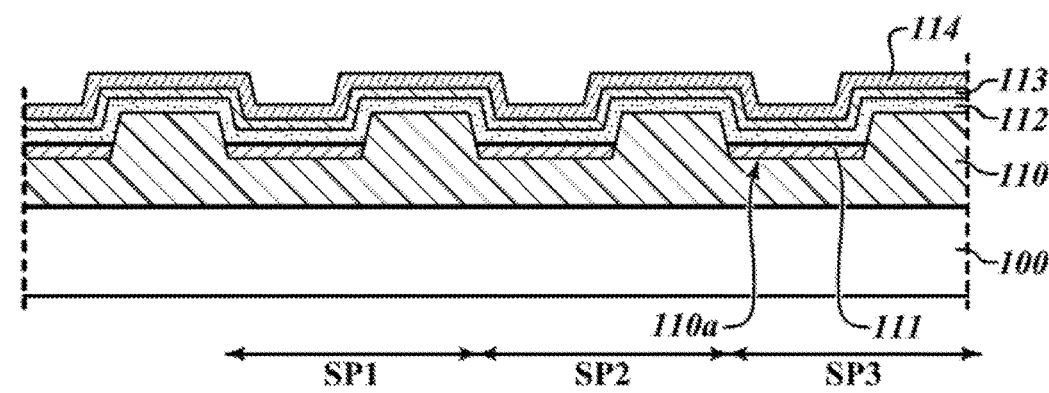

The difference from the above-described method of manufacturing the organic light-emitting diode is that a red sub-pixel, a green sub-pixel and a blue sub-pixel, which are respectively indicated by a first sub-pixel SP1, a second sub-pixel SP2 and a third sub-pixel SP3, are defined. The colors of the sub-pixels are determined by the color filters that are formed in a final step. The colors are not limited to red, green and blue, but may be any other colors. In one embodiment, white light is emitted through the combination of the colors. In other embodiments, white light itself is one of the colors being emitted, along with red, green and blue. Further, there are embodiments in which two of the same color of sub-pixels are provided in a single pixel, for example, the sequence of sub-pixels could be red, blue, green, blue in one design, while they are red, blue, white, green, blue in another design, for a single pixel. Subsequently, as shown in FIG. 7E, a protective layer 114 is formed on the second electrode 113.

The protective layer 114 is formed so as to have an area larger than the area of the second electrode 113, in order to protect the organic light-emitting diode from external moisture or oxygen.

Figure 7F:
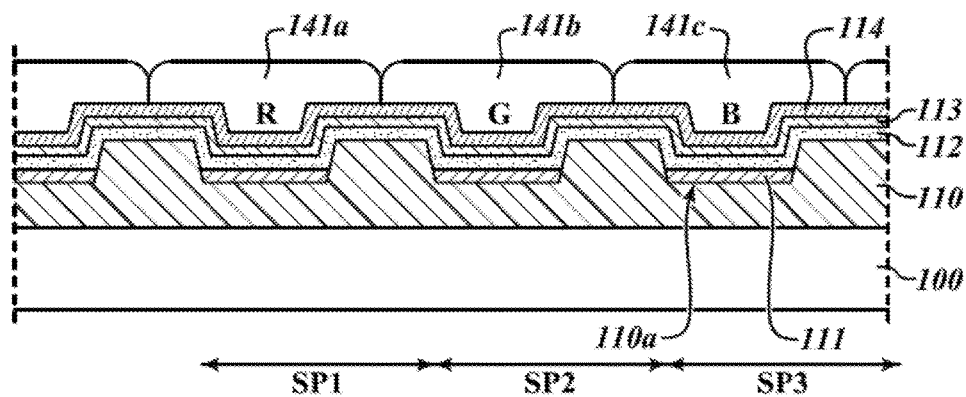

Subsequently, as shown in FIG. 7F, liquid-type color filter materials are coated on the second electrode 113 so to fill the recesses 110a corresponding to the respective sub-pixels SP1, SP2, and SP3. Sufficient color filter material will be deposited in some embodiments over flow the top, as shown in FIG. 7F, then it be etched back to desired height above layer 114 if desired. Namely, sufficient color filter material is deposited to fully fill and in some cases, overfill each respective recess. The amount of overfilled might not be the same for each pixel. This is acceptable because in the next step, as shown in FIG. 7G, a planarization step can be carried out to provide a smooth, flat top surface for all color filters that each have all their top surfaces in the same plane.

The liquid-type color filter materials include a red color filter material, a green color filter material and a blue color filter material, which are sequentially coated. After the coating of the color filter materials, a pre-bake process is performed so that each of the color filter materials remains corresponding to a respective one of the sub-pixels. In this case, the later-formed color filter materials may remain in a state of overlapping the previously-formed color filter materials at the boundary between adjacent sub-pixels, and the top surfaces of the color filter materials that have undergone the pre-bake process may not be flat. However, the recesses are individually filled with the respective color filter materials, each having a unique color for the corresponding sub-pixel, in a coating (or dotting) manner. The color filters may be formed by any acceptable conventional technique, many of which are known in the art. Therefore, all the particular details by which the color filters are formed and positioned on the array are not described in detail.

Figure 7G:
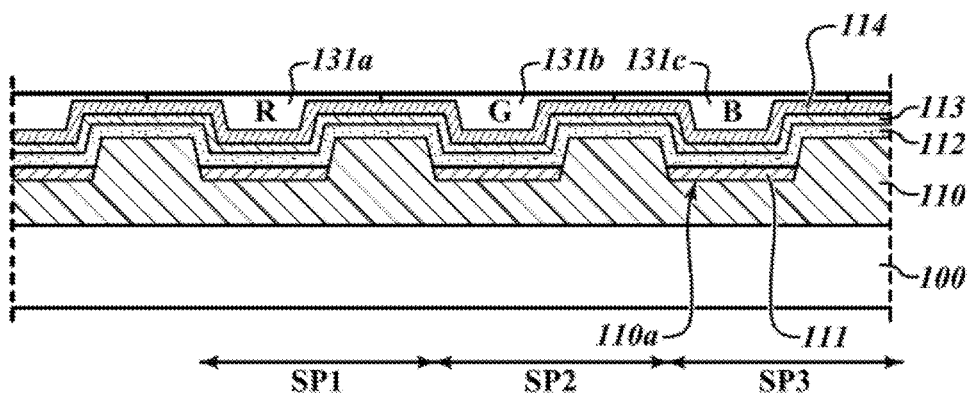

Subsequently, as shown in FIG. 7G, the color filter materials corresponding to the respective sub-pixels are hardened through a post-bake process and are subjected to an ashing process, thus completing the formation of the color filter layers 131a, 131b and 131c, which are located adjacent to the protective layer 114 and have flat top surfaces. Through this process, the portions of the color filter materials that overlap each other are removed, and the color filter layers 131a, 131b and 131c are formed so as to be in contact at lateral portions thereof with each other in the respective sub-pixels and to have flat surfaces.

Figure 7H:
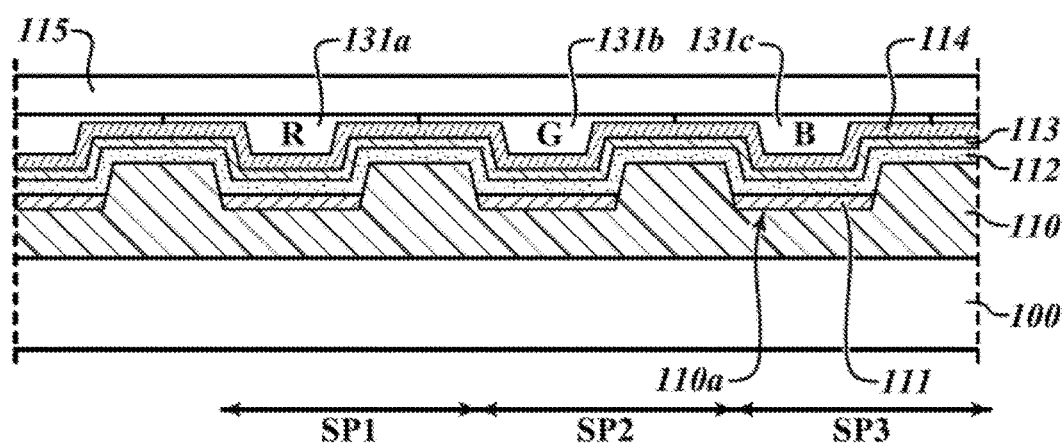

Subsequently, as shown in FIG. 7H, the second protective layer 115 is formed on the color filter layers 131a, 131b and 131c.

According to the method of manufacturing the organic light-emitting display device of the present disclosure, after the formation of the organic light-emitting diode, the process of forming the color filters in the recesses is performed, which has the effect of reducing the number of masks required by omitting the use of masks, which are required for the formation of a color filter array in a conventional structure, in which a color filter array substrate is separately provided.

In addition, according to the organic light-emitting display device of the present disclosure, since the color filters are disposed in the recesses, a separate counter substrate or black matrix for forming a color filter array is unnecessary, thus preventing degradation of the aperture ratio and light leakage due to misalignment between a substrate and a counter substrate.

In addition, the color filters are provided in the recesses through a solution process and the recesses are filled with the color filters through hardening and ashing processes. Therefore, the color filters, which have flat top surfaces, are formed without deviation from the region including a light-emitting region in the respective sub-pixels, and an existing black matrix, which is provided to prevent color mixture between the adjacent sub-pixels, may be unnecessary.

In addition, according to the organic light-emitting display device of the present disclosure, the overcoat layer, which is an insulation film provided for planarization of the thin film transistor on the substrate, is provided with the recesses corresponding to the respective sub-pixels, the first electrode is formed on the bottom surface of each of the recesses, and the organic film and the second electrode are formed along the concave-convex surface of the insulation film after the formation of the first electrode, thereby defining the region at which the first electrode is formed as a light-emitting region and consequently realizing a bank-less structure in which an existing bank, which is an additional element for defining a light-emitting region, is omitted.

In addition, in such a bank-less structure, since the lateral portion of each of the recesses has a positive taper shape, an organic material is conformally deposited to a constant thickness on the lateral portion of each of the recesses, thereby preventing concentration of current in the corner and deterioration due to deposition of the organic material to a small thickness.

In addition, according to the organic light-emitting display device of the present disclosure, the first electrode that composes the organic light-emitting diode is formed in a self-alignment manner owing to the recesses without the necessity of a photo mask, and further the formation of a bank is omitted. Therefore, the use of masks for the formation of a bank and the formation of the organic light-emitting diode may be omitted.

Figure 8:
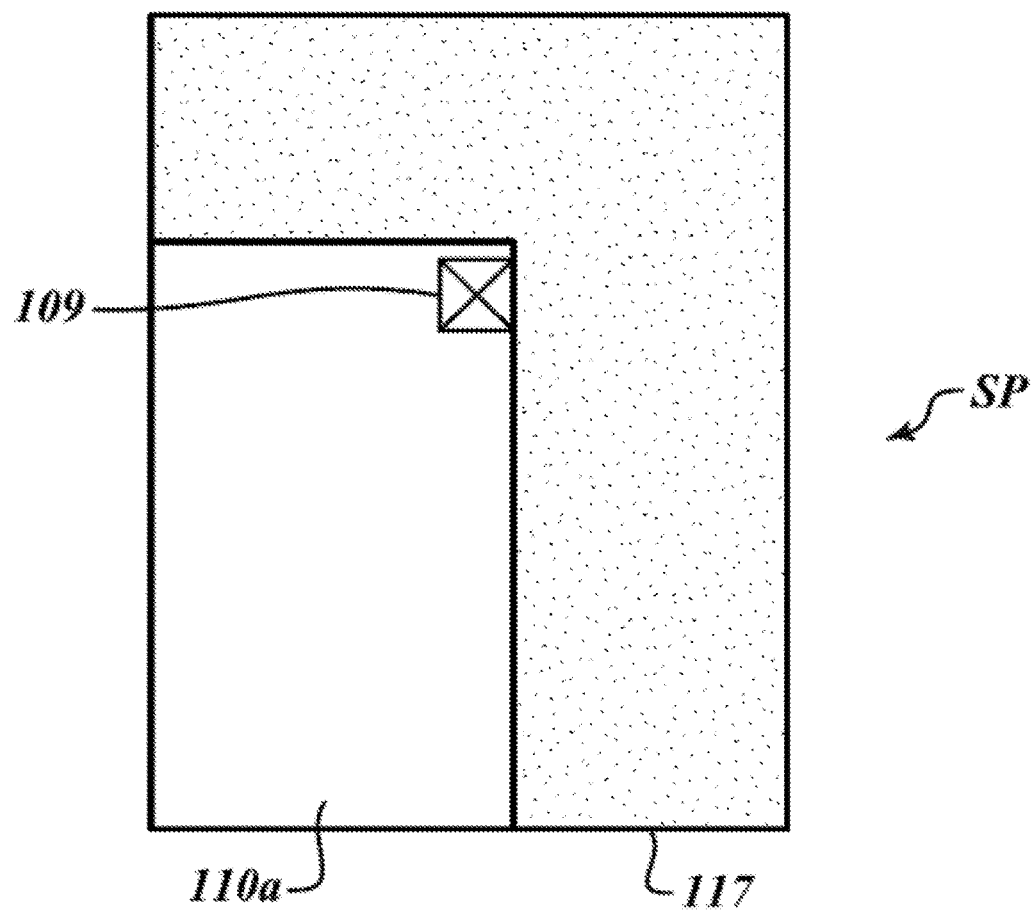
FIG. 8 is a plan view of the organic light-emitting display device of the present disclosure.

FIG. 8 is a plan view of a sub-pixel SP of the organic light-emitting display device of the present disclosure.

As shown in FIG. 8, the organic light-emitting display device of the present disclosure is structured such that each sub-pixel SP has a bottom surface region of each recess 110a formed in the insulation film 110 as a light-emitting region and the remaining region 117 as a non-light-emitting region. The first electrode 111 (refer to FIG. 3) is disposed on the bottom surface of each of the recesses 110a without overlapping with the non-light-emitting region, thus using the entire area of the first electrode 111 for light emission. Further, the organic film 112 is formed using the structure of the recesses 110a without the use of a photo mask, thus preventing degradation of the aperture ratio due to misalignment between layers. Further, since the color filter layers 131a, 131b and 131c (refer to FIGS. 6A and 6B) are disposed in the corresponding recesses 110a, the light is output in the form of approximately straight light, thus making it possible to omit a counter substrate. As a result, it is possible to reduce degradation of the aperture ratio and transmittance due to an adhesive layer or a black matrix as compared to a conventional structure including a counter substrate.

Hereinafter, the electric connection between the organic light-emitting diode and the thin film transistor in each of the sub-pixels of the present disclosure will be described briefly.

Figure 9:
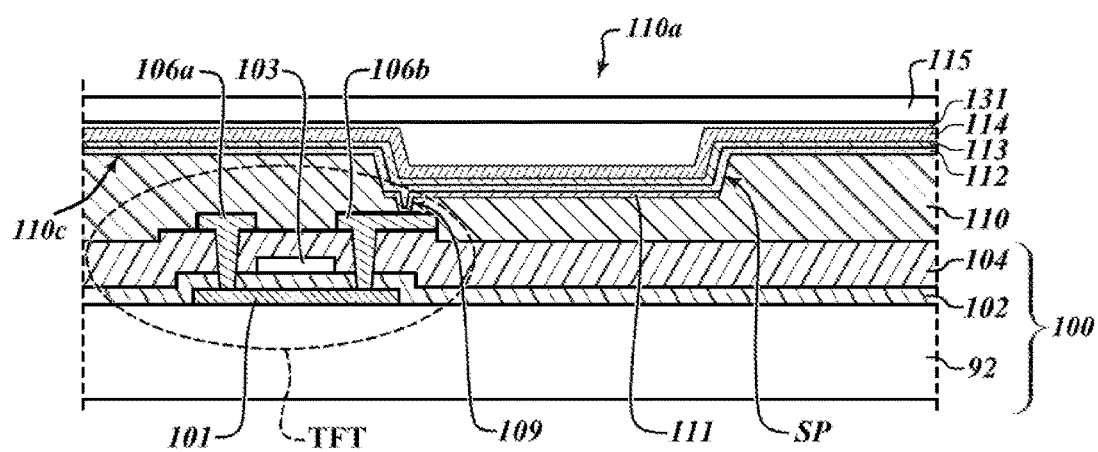
FIG. 9 is a sectional view showing the electric connection between the organic light-emitting diode and a thin film transistor in the organic light-emitting display device of the present disclosure.

FIG. 9 is a sectional view showing the electric connection between the organic light-emitting diode and the thin film transistor in the organic light-emitting display device of the present disclosure.

As shown in FIG. 9, according to the organic light-emitting display device of the present disclosure, the thin film transistor (TFT) is disposed corresponding to each of the sub-pixels as part of the substrate 100. The substrate 100 includes a plurality of various layers, including a support layer 92, a first insulation layer 102 and a second insulation layer 104. It also includes a semiconductor layer 101 disposed on a predetermined region of the support layer 92, a gate insulation film 102 covering the semiconductor layer 101, a gate electrode 103 disposed on a region of the gate insulation film 102 that corresponds to the semiconductor layer 101, an interlayer insulation film 104 covering the gate electrode 103, and a source electrode 106a and a drain electrode 106b, which are electrically connected to two opposite end portions of the semiconductor layer 101 through a via hole formed in the interlayer insulation film 104 and the gate insulation film 102. Preferably, a TFT may be provided for each sub-pixel and may be located in the isolation regions between each recess, but these are not shown for ease in illustration.

In the example shown, the substrate 100 on which the light-emitting pixels are formed contains various layers within it. The substrate 100 can be considered to start at any acceptable layer and can include multiple layers having various electrical circuits and connections therein or it can be a basic fully insulating substrate whose sole function is to support the light-emitting layers. The term substrate is thus used in it broadest sense to be a supporting layer or layers for any material above it.

It should be noted that the form of the thin film transistor used in the organic light-emitting display device of the present disclosure is not limited to the top-gate type illustrated in the drawing but may be any one selected from among the bottom-gate type, the top-gate type, and a combination thereof.

Further, the semiconductor layer 101 may be embodied as an amorphous silicon layer, a polysilicon layer, an oxide semiconductor layer or the like.

In this case, the thin film transistor further includes an inorganic protective layer (not shown) provided on the entire area thereof to protect the same. Subsequently, the above-described insulation film 110, that is, the overcoat layer, is formed to a thickness sufficient for planarization. In some cases, the insulation film 110 may have a multi-layer structure.

The recess 110a and the contact hole 109 of the insulation film 110 may be located on the drain electrode 106b in each of the sub-pixels. In this case, the contact hole 109 has a smaller diameter than the recess 110a and is located under the bottom surface of the recess 110a. The first electrode 111, which is disposed on the bottom surface of the recess 110a, is electrically connected to the exposed portion of the drain electrode 106b through the contact hole 109.

Here, the contact hole 109 and the recess 110a may be defined through the same process and the same mask. That is, the contact hole 109 and the recess 110a may be defined together through a single exposure process using a half-tone or multi-tone mask or using a mask having a diffraction pattern corresponding to the recess 110a and having a light-blocking portion or an opening corresponding to the contact hole 109.

The thickness from the flat surface (the separation wall) 110c of the insulation film 110 to the bottom surface of the recess 110a is a portion of the overall thickness of the insulation film.

The protective layer 114 disposed on the recess 110a is formed lower than the flat surface 110c of the insulation film 110 so that the color filter 131, which is formed after the formation of the protective layer 114, can be introduced into the concave region. The color filter 131 fully fills the recess 110a and a top surface of the color filter 131 has flat.

A second protective layer 115 is disposed on the flat top surface of the color filter 131.

As is apparent from the above description, an organic light-emitting display device and a method of manufacturing the same have the following effects.

First, an overcoat layer, which is an insulation film provided for planarization of a thin film transistor on a substrate, is provided with recesses corresponding to respective sub-pixels, a first electrode is formed on the bottom surface of each of the recesses, and an organic film and a second electrode are formed along the concave-convex surface of the insulation film after the formation of the first electrode, thereby defining the region at which the first electrode is formed as a light-emitting region and consequently realizing a bank-less structure in which an existing bank, which is an additional element for defining a light-emitting region, is omitted.

There are many techniques for forming recesses in insulating layers which are very well known in the art and that have been refined over many years, as used in the manufacture of integrated circuits. Accordingly, the recesses 110a can be made having any desired shape or pattern. They can be individual recesses which are isolated from each other, having the separation wall 110c completely surrounding the top of them. Therefore, an electrode 111 formed in the bottom layer thereof is self-aligned and also automatically electrically isolated from all other electrodes. Because the flat portions 110 surround each recess, the electrode 111 at the bottom of each recess is automatically electrically isolated from all other electrodes as part of the formation process, thus avoiding the use of additional masks. The recess 110a also provides the benefit that the organic film 112 as well as the second electrode 113 and the color filters 131 will be self-aligned with the electrode as well.

Second, in the bank-less structure, since the sidewalls 110b of each of the recesses has a positive taper shape, an organic material is easily deposited to a constant thickness on the lateral portion of each of the recesses, thereby preventing the concentration of current in the corner and deterioration due to deposition of the organic material to a small thickness.

Third, since color filters are disposed in the recesses, a separate counter substrate for forming a color filter array is unnecessary, thus preventing degradation of the aperture ratio and light leakage due to misalignment between a substrate and a counter substrate. Further, as noted, each color filter can have a different thickness to achieve a desired color output and light luminosity from each sub-pixel. In some instances, the depth of each recess will be custom-selected to achieve a desired luminosity value from each sub-pixel.

Fourth, the color filters are provided in the recesses through a solution process and the recesses are filled with the color filters through hardening and ashing processes. Therefore, the color filters, which have flat top surfaces, are formed without deviation from the region including a light-emitting region in the respective sub-pixels, and an existing black matrix, which is provided to prevent color mixture between the adjacent sub-pixels, may be unnecessary.

Fifth, according to the organic light-emitting display device of the present disclosure, the first electrode that composes the organic light-emitting diode is formed in a self-alignment manner owing to the recesses without the use of a photo mask. Therefore, the first electrode may be located at a position that perfectly corresponds to the light-emitting region, thus preventing misalignment of the first electrode.

Sixth, since the formation of a bank is omitted, the use of masks for the formation of a bank and the formation of the organic light-emitting diode may also be omitted.

Finally, after the formation of the organic light-emitting diode, a process of forming the color filters in the recesses is performed, which has the effect of reducing the number of masks required by omitting the use of masks at various steps, which are required for the formation of a color filter array in a conventional structure, in which a color filter array substrate is separately provided.

The features, structures and effects and the like described in association with the embodiments above are incorporated into at least one embodiment of the present disclosure, but are not limited only to the one embodiment. Furthermore, the features, structures and effects and the like exemplified in association with respective embodiments can be implemented in other embodiments by combination or modification by those skilled in the art. Therefore, contents related to such combinations and modifications should be construed as falling within the scope of the present disclosure.

In addition, while the present disclosure has been particularly described with reference to exemplary embodiments, the present disclosure is not limited thereto. It will be understood by those skilled in the art that various modifications and applications, which are not illustrated above, may be made without departing from the spirit and scope of the present disclosure. For example, each component illustrated in the embodiments may be modified and made.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display device, comprising:
   a substrate having circuits for a plurality of sub-pixels;
   an insulation film disposed on the substrate, the insulation film including recesses each having a bottom surface and flat surfaces positioned adjacent to a corresponding one of the recesses, a pair of a recess and a flat surface corresponding to each of the sub-pixels;
   a first electrode disposed on the bottom surface of each recess in each of the sub-pixels;
   an organic film disposed on the insulation film and on the first electrode disposed in each recess, the organic film including an organic light-emitting layer;
   a second electrode disposed on the organic film; and
   color filters disposed on the second electrode, each color filter filling one of the recesses corresponding to each of the sub-pixels,
   wherein the color filters are in contact at lateral portions thereof with each other in adjacent ones of the sub-pixels.

2. The organic light-emitting display device according to claim 1, further comprising:
   a first protective layer disposed on a top surface of each color filter.

3. The organic light-emitting display device of claim 1, wherein each recess is surrounded by adjacent flat surfaces and each first electrode is disposed only on the bottom surface of each recess.

4. The organic light-emitting display device according to claim 1, further comprising:
   a second protective layer disposed between the second electrode and the color filters.

5. The organic light-emitting display device according to claim 4, wherein each recess has a sidewall having a positive taper shape towards the bottom surface.

6. The organic light-emitting display device according to claim 5, wherein the organic film, the second electrode and the second protective layer are formed along the flat surfaces of the insulation film and the sidewalls and the bottom surface of each recess, each of the organic film, the second electrode and the second protective layer having a uniform thickness.

7. The organic light-emitting display device according to claim 1, wherein the organic film is configured to emit white light.

8. The organic light-emitting display device according to claim 1, further comprising:
   a thin film transistor disposed corresponding to each of the sub-pixels of the substrate,
   wherein the insulation film further includes a contact hole formed under the bottom surface of each recess in order to expose a portion of the thin film transistor.

9. The organic light-emitting display device according to claim 1, wherein the bottom surface of each recess is located such that a thickness from a top surface of the insulation film to the bottom surface of the recess is a portion of an overall thickness of the insulation film.

10. An organic light-emitting display device comprising:
    a substrate having circuits for a plurality of sub-pixels;
    an insulation film disposed on the substrate, the insulation film including recesses each having a bottom surface and flat surfaces positioned adjacent to a corresponding one of the recesses, a pair of a recess and a flat surface corresponding to each of the sub-pixels;
    a first electrode disposed on the bottom surface of each recess in each of the sub-pixels;
    an organic film disposed on the insulation film and on the first electrode disposed in each recess, the organic film including an organic light-emitting layer;
    a second electrode disposed on the organic film;
    color filters disposed on the second electrode, each color filter filling one of the recesses corresponding to each of the sub-pixels;
    a first recess among the plurality of recesses, the first recess having a first depth; and
    a second recess among the plurality of recesses, the second recess having a second depth that is greater than the first depth.

11. The organic light-emitting display device according to claim 7, wherein portions of the second protective layer disposed in on each the recess is formed lower than the top surface of the insulation film.

12. A method of manufacturing an organic light-emitting display device, comprising:

preparing a substrate having a plurality of sub-pixels;
forming an insulation film on the substrate;
forming a plurality of recesses in the insulating film, each recess having a bottom surface and being separated from the bottom surface of each adjacent recess by sidewalls and an upper surface;
forming a first electrode on the bottom surface of each recess;
forming an organic film overlying the first electrode in each recess; and
forming a second electrode overlying the organic film; and
forming color filters that are overlying the second electrode in each recess to fully fill any remaining portions of each recess,
wherein the color filters are in contact at lateral portions thereof with each other in adjacent ones of the sub-pixels.

13. The method according to claim 12, wherein the upper surface of the insulation film around the recesses is flat.

14. The method according to claim 12, wherein the forming the first electrode includes:
forming a first electrode material to a uniform thickness on the insulation film including the recesses;
forming a photosensitive resist on the first electrode material to have a top surface;
exposing the first electrode material on each of the upper surface of the insulation film by performing removing the photosensitive resist; and
etching the first electrode material using the photosensitive resist as a mask to remove all the first electrode material that is outside of each recess.

15. The method according to claim 12, further comprising:
hardening the color filters.

16. The method according to claim 15, further comprising:
removing an upper layer of each of the color filters to create a planar upper surface on each color filter.

17. The method according to claim 12, further comprising:
forming a contact hole in the bottom surface of each recess after the recess is formed; and
depositing a conductive layer in the contact hole and in the recess to form the first electrode and a contact electrode to a transistor positioned below the insulating film in a single deposition step.

* * * * *